US012157145B2

(12) United States Patent
Elian et al.

(10) Patent No.: US 12,157,145 B2
(45) Date of Patent: Dec. 3, 2024

(54) INTEGRATION OF A SENSOR SYSTEM IN A CASING

(71) Applicant: Infineon Technologies AG, Neubiberg (DE)

(72) Inventors: Klaus Elian, Alteglofsheim (DE); Matthias Eberl, Taufkirchen (DE); Fabian Merbeler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 17/865,504

(22) Filed: Jul. 15, 2022

(65) Prior Publication Data

US 2023/0023572 A1     Jan. 26, 2023

(30) Foreign Application Priority Data

Jul. 23, 2021    (DE) .......................... 102021119150.5

(51) Int. Cl.
| | |
|---|---|
| *B06B 1/02* | (2006.01) |
| *B06B 1/06* | (2006.01) |
| *G01H 11/06* | (2006.01) |
| *H10N 30/20* | (2023.01) |

(52) U.S. Cl.
CPC .......... *B06B 1/0292* (2013.01); *B06B 1/0666* (2013.01); *G01H 11/06* (2013.01); *H10N 30/2047* (2023.02); *B06B 2201/70* (2013.01)

(58) Field of Classification Search
CPC . B06B 1/0292; B06B 1/0666; B06B 2201/70; G01H 11/06; H10N 30/2047
See application file for complete search history.

(56) References Cited

U.S. PATENT DOCUMENTS

| | | | |
|---|---|---|---|
| 7,732,915 B2 | 6/2010 | Dangelmaier et al. | |
| 7,847,387 B2 | 12/2010 | Kilger et al. | |
| 11,860,272 B2* | 1/2024 | Elian | ...................... G01S 7/521 |
| 2005/0251044 A1 | 11/2005 | Hoctor et al. | |
| 2008/0053233 A1 | 3/2008 | Sugiura | |
| 2014/0125193 A1 | 5/2014 | Chowdhury | |
| 2017/0135212 A1 | 5/2017 | Huang et al. | |
| 2020/0101492 A1 | 4/2020 | Akiyama et al. | |
| 2022/0069203 A1 | 3/2022 | Stavrev et al. | |
| 2023/0009285 A1* | 1/2023 | Schaller | ............... G01N 33/005 |

(Continued)

FOREIGN PATENT DOCUMENTS

| | | | | |
|---|---|---|---|---|
| DE | 102005046008 B4 * | 5/2007 | ........... | B81B 7/0058 |
| DE | 102008057297 A1 * | 5/2009 | ............. | B81B 7/007 |

(Continued)

OTHER PUBLICATIONS

Translation of WO-2014207125 (Year: 2014).*

*Primary Examiner* — Daniel Pihulic
(74) *Attorney, Agent, or Firm* — Harrity & Harrity, LLP (57) ABSTRACT

A sensor system for attachment to a casing includes at least one sensor element, where the sensor element is configured for detecting an environment property of an environment which, with the sensor system attached to the casing, is situated on the opposite side of the casing with respect to the sensor system. The sensor system also includes an encapsulation layer, where the sensor element is embedded in the encapsulation layer, and where the encapsulation layer has a contact surface for attaching the sensor system to the casing.

23 Claims, 7 Drawing Sheets

(56) References Cited

U.S. PATENT DOCUMENTS

| | | | | |
|---|---|---|---|---|
| 2023/0010130 A1* | 1/2023 | Schaller | ................ | G06F 1/1671 |
| 2023/0023572 A1* | 1/2023 | Elian | ..................... | B06B 1/0666 |
| 2023/0063120 A1* | 3/2023 | Elian | ..................... | G06F 3/0436 |
| 2023/0152448 A1* | 5/2023 | Elian | ....................... | G01S 15/04 |
| | | | | 345/177 |
| 2023/0315235 A1* | 10/2023 | Elian | ..................... | B60K 35/00 |
| | | | | 345/177 |
| 2023/0341311 A1* | 10/2023 | Elian | ................. | G01N 15/0606 |

FOREIGN PATENT DOCUMENTS

| | | | | | |
|---|---|---|---|---|---|
| DE | 102010027502 | A1 | | 1/2011 | |
| DE | 102015202393 | A1 | | 8/2016 | |
| DE | 102016102667 | A1 | | 8/2017 | |
| DE | 102021117778 | A1 * | 1/2023 | ........... G01N 33/005 |
| DE | 102021119150 | A1 * | 1/2023 | ........... B06B 1/0292 |
| DE | 102021129855 | A1 * | 5/2023 | ............. G01S 15/04 |
| DE | 102022107944 | A1 * | 10/2023 | ............. G06F 3/043 |
| DE | 102020122871 | B4 * | 12/2023 | ........... B81B 3/0032 |
| EP | 3014234 | B1 * | 7/2021 | ......... A47L 15/4287 |
| WO | WO-2014207125 | A1 * | 12/2014 | ........ A47L 15/4287 |
| WO | WO-2021016622 | A1 * | 1/2021 | ............. A41D 1/002 |

* cited by examiner

Fig. 14

INTEGRATION OF A SENSOR SYSTEM IN A CASING

RELATED APPLICATION

This application claims priority to German Patent Application No. 102021119150.5, filed on Jul. 23, 2021, which is incorporated herein by reference in its entirety.

FIELD

The present disclosure relates to a sensor system for attachment to a casing.

BACKGROUND

Interaction of a user with an electronic system is necessary in many fields of application. In a motor vehicle, for example, a switch for actuating the windshield ventilation and a corresponding display are required.

Increasingly there is a desire for inconspicuous integration of such sensor systems in existing casings.

SUMMARY

One or more embodiments is directed to an inconspicuous integration of a sensor system in a casing One or more embodiments provides a sensor system for attachment to a casing, including at least one sensor element, wherein the sensor element is configured for detecting an environment property of an environment which, with the sensor system attached to the casing, is situated on the opposite side of the casing with respect to the sensor system, and including an encapsulation layer, wherein the sensor element is embedded in the encapsulation layer, and wherein the encapsulation layer has a contact surface for attaching the sensor system to the casing.

BRIEF DESCRIPTION OF THE DRAWINGS

Examples of the proposed sensor system will now be explained in greater detail with reference to the drawing. In the drawing.

DETAILED DESCRIPTION

Figure 1:
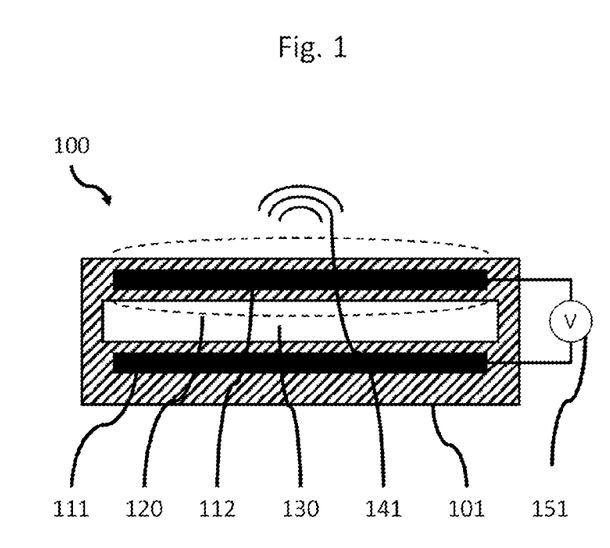
FIG. 1 shows an ultrasonic transceiver.
Figure 2:
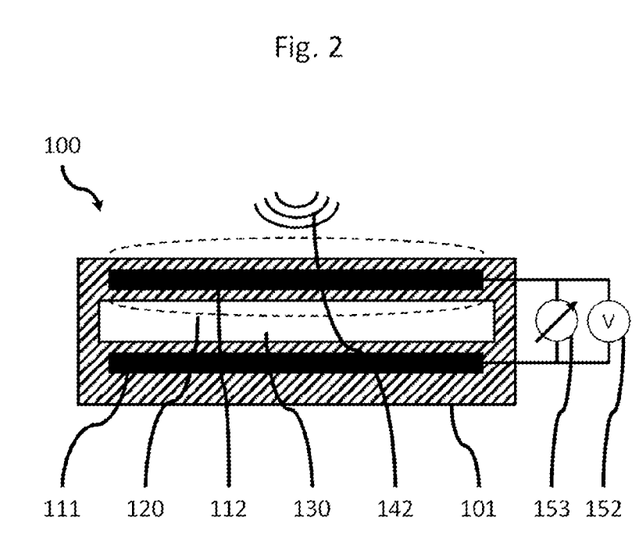
FIG. 2 shows an ultrasonic transceiver.

FIGS. 1 and 2 illustrate a sensor element 100, the sensor element 100 being an ultrasonic transceiver. The ultrasonic transceiver can be both an ultrasonic receiver configured to receive ultrasonic waves and an ultrasonic transmitter configured to transmit ultrasonic waves. The ultrasonic transceiver can in particular also be configured both to receive and to transmit ultrasonic waves. The sensor element 100 has a membrane 120 with an electrode 112 and a substrate 101 with an electrode 111. A cavity 130 is provided between the membrane 120 and the substrate 101, and enables a movement of the membrane 120.

Applying an AC voltage between the electrodes 111 and 112 by means of a voltage source 151 enables the membrane 120 to be excited to oscillate, such that the sensor element 100 can transmit ultrasonic waves 141.

The sensor element 100 shown in FIGS. 1 and 2 can likewise be used to detect ultrasonic waves 142. For this purpose, a DC voltage can be applied between the electrodes 111 and 112 by means of the voltage source 152. The ultrasonic waves 142 can excite the membrane 120 to oscillate. An AC voltage is induced owing to the resulting changing distance between the electrodes 111 and 112, and can be measured by a measuring device 153.

FIGS. 3 to 6 schematically illustrate how the sensor element 311 or respectively 411 can be used to detect an environment property of an environment which, with the sensor system attached to a casing 390, 490, is situated on the opposite side of the casing 390, 490 with respect to the sensor system. The sensor element 311 or respectively 411 illustrated in FIGS. 3 to 6 is once again an ultrasonic transceiver. The sensor element 311 or respectively 411 is in each case embedded in an encapsulation layer 320, 420, the encapsulation layer 320, 420 having a contact surface, by which the sensor system is attached to the casing 390, 490. The sensor element 311, 411 can in each case be secured on a printed circuit board 370, 470 and be electrically connected thereto. The printed circuit board 370, 470 can be in particular a flexible printed circuit board.

Figure 3:
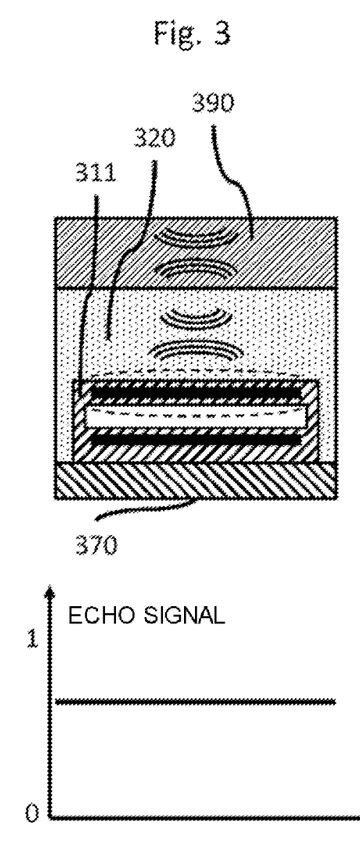
FIG. 3 shows an ultrasonic transceiver in a first situation.

As shown in FIG. 3, ultrasonic waves can be generated by means of the sensor element 311, which are transmitted substantially completely through the interface between the encapsulation layer 320 and the casing 390 and are subsequently reflected at the free space of the casing 390 at the opposite side with respect to the encapsulation layer 320. After repeated transmission through the interface between the casing 390 and the encapsulation layer 320, the ultrasonic waves can be detected by the sensor element 311 again, such that an echo signal, as is shown under FIG. 3, is obtained.

Figure 4:
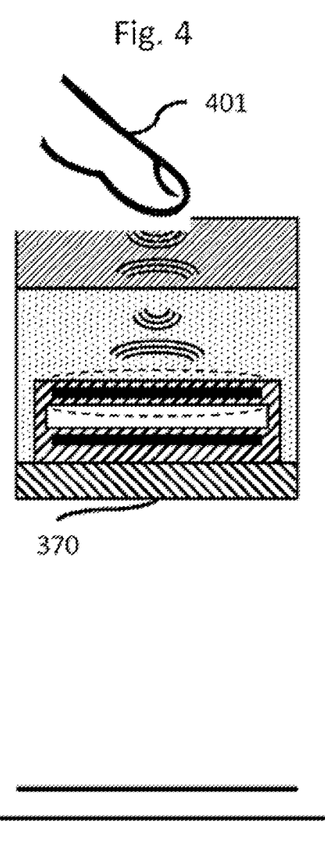
FIG. 4 shows the ultrasonic transceiver shown in FIG. 3 in a second situation.

In the case where the free surface of the casing 390 at the opposite side with respect to the encapsulation layer 320 is touched, for example by a finger 401, only a smaller proportion of the ultrasonic waves is reflected at the free, in particular smooth and/or planar, surface and the echo signal decreases, as is illustrated under FIG. 4.

Figure 5:
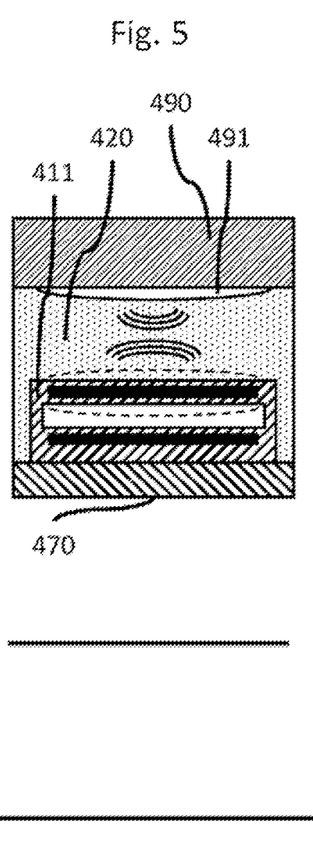
FIG. 5 shows an ultrasonic transceiver in a third situation.

FIG. 5 illustrates that a hollow space 491 remained when the sensor system was attached to the casing 490. Said hollow space 491 has the consequence that the ultrasonic waves transmitted by the sensor element 411 do not pass through the interface between the encapsulation layer 420 and the casing 490, but rather are reflected at this interface, such that an echo signal, as is illustrated underneath, is obtained.

Figure 6:
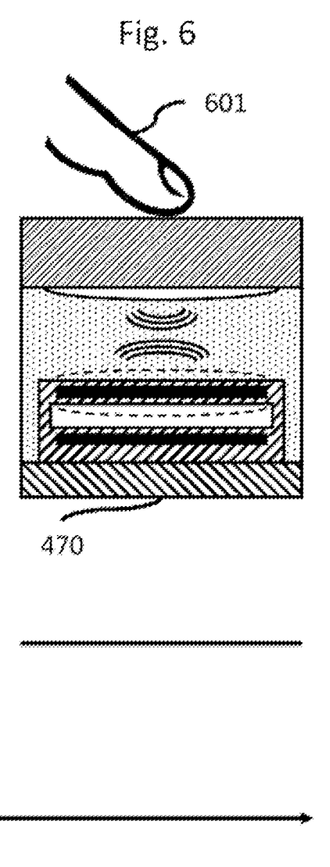
FIG. 6 shows the ultrasonic transceiver shown in FIG. 5 in a fourth situation.

Since the ultrasonic waves are not (or hardly) transmitted into the casing, the echo signal is not changed as a result of the casing 490 being touched by the finger 601.

Even though a capacitive sensor element 311, 411 has been described above, corresponding considerations are also applicable to a piezoelectric sensor element, in particular to ultrasonic transceivers which operate according to a piezoelectric measurement principle.

Figure 7:
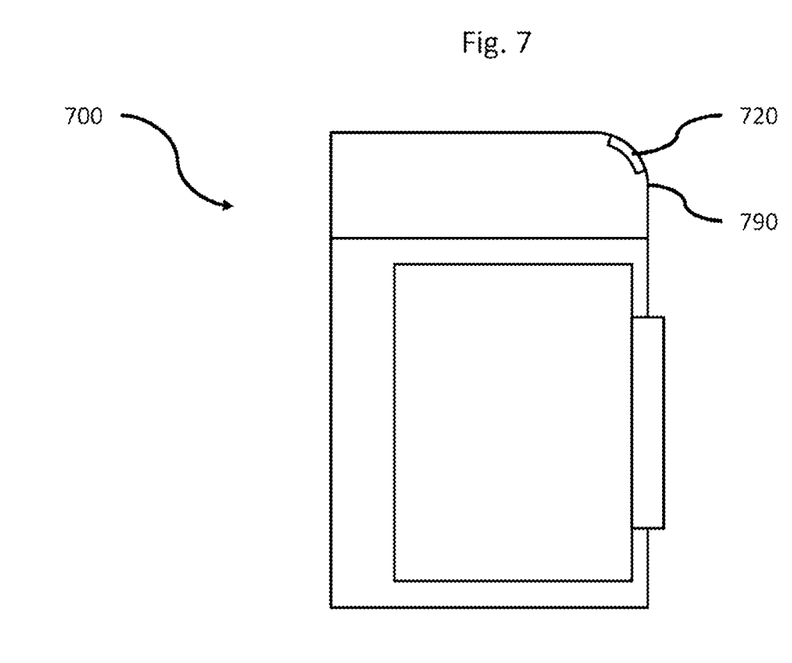
FIG. 7 shows a domestic appliance.

FIG. 7 illustrates a domestic appliance 700 as an example of a use of the proposed sensor system. The domestic appliance 700 can be a washing machine, for example. A sensor system 720 is provided on a casing 790 of the domestic appliance 700, and can be used to change or check settings of the domestic appliance 700.

Figure 8:
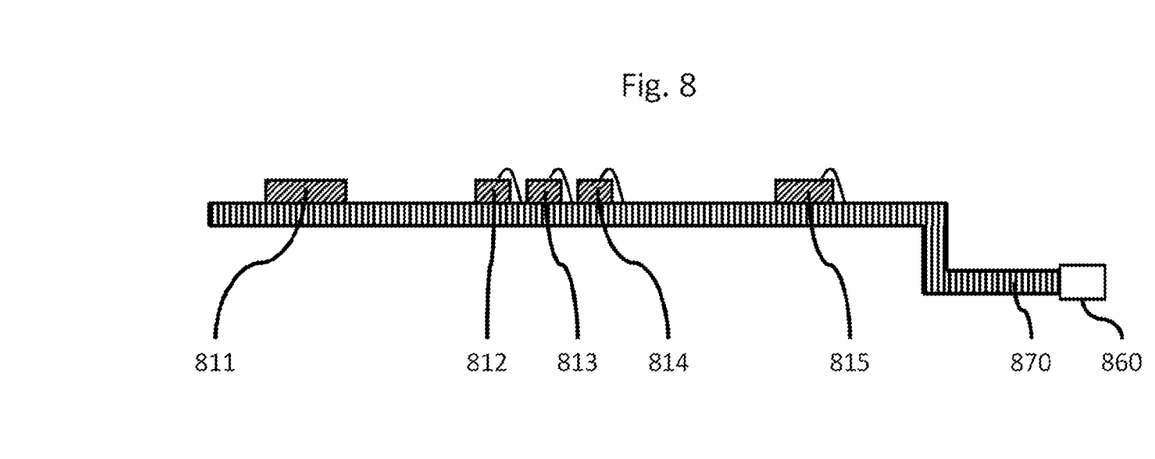
FIG. 8 shows a step for producing a sensor system.

FIG. 8 shows a step for producing a sensor system. On a printed circuit board 870, in particular a flexible printed circuit board (flexible PCB), a plurality of sensor elements 811, 812, 813, 814, 815 can be arranged and mechanically and electrically connected to the printed circuit board 870. The printed circuit board 870 and/or at least one of the sensor elements 811, 812, 813, 814, 815 can have an integrated circuit. A plug connector 860 can be attached to the printed circuit board 870. The sensor elements 811, 812, 813, 814, 815 can be fabricated from a semiconductor material. By way of example, the sensor element 811 can be an ultrasonic transceiver. The sensor elements 812, 813, 814 can be light-emitting diodes. In principle, it would likewise be conceivable to use laser diodes as sensor elements. The sensor element 815 can be a photodiode.

Figure 9:
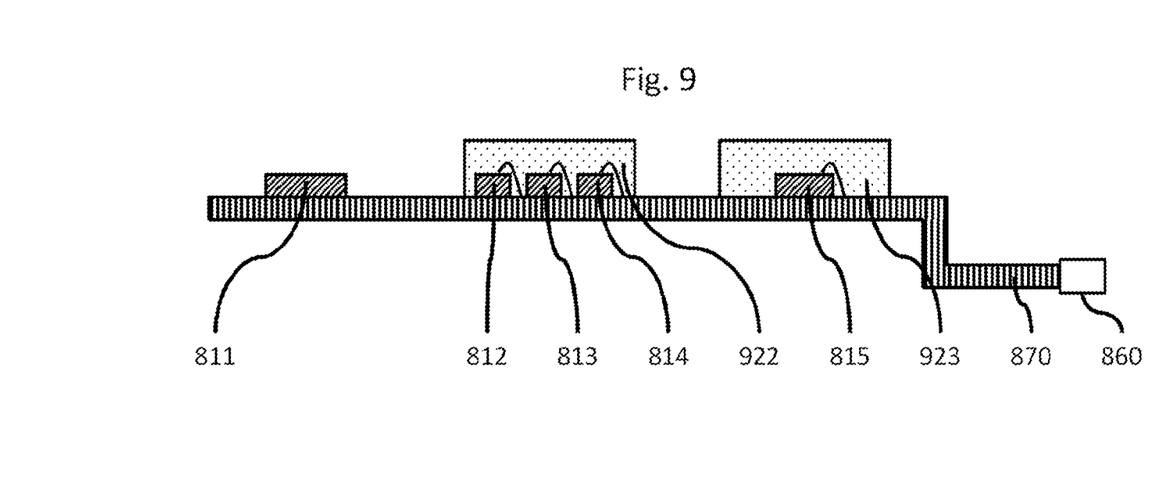
FIG. 9 shows a step for producing a sensor system.

Materials can in each case be applied in the region of the sensor elements 812, 813, 814 and of the sensor element 815, and can form translucent, in particular transparent, sections 922, 923 of an encapsulation layer of the sensor system to be produced, as is shown in FIG. 9.

Figure 10:
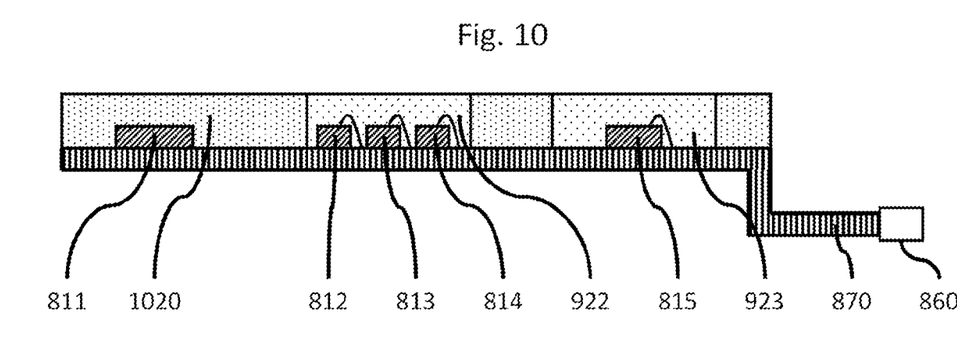
FIG. 10 shows a step for producing a sensor system.
Figure 11:
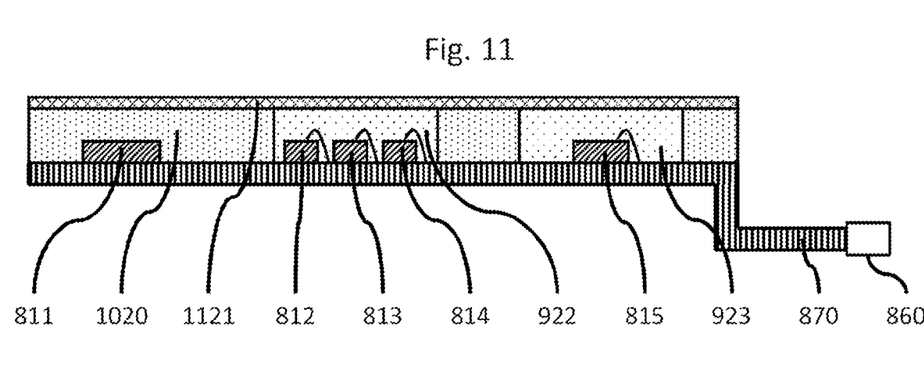
FIG. 11 shows a step for producing a sensor system.
Figure 12:
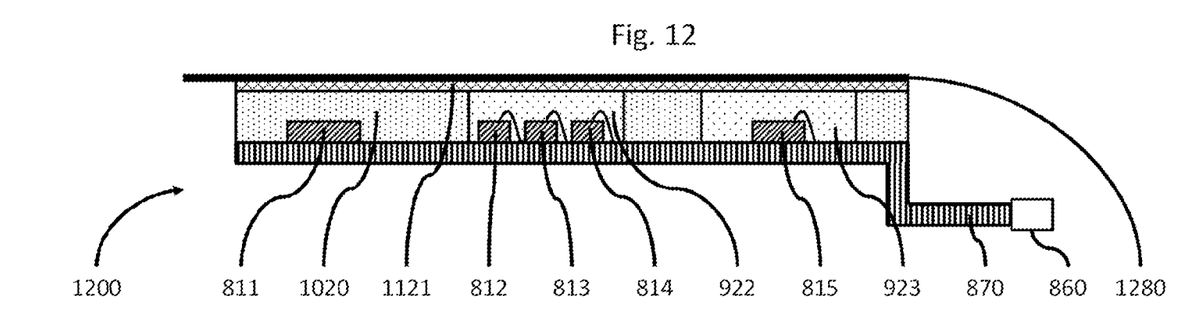
FIG. 12 shows a step for producing a sensor system.

The further regions of the populated printed circuit board 870 can be encapsulated with a further encapsulation material 1020 (cf. FIG. 10) and an adhesive layer 1121 can subsequently be applied (cf. FIG. 11) and said adhesive layer can be covered with a protective film 1280, with the result that the sensor system 1200 is obtained. The sensor system 1200 can be produced independently of the casing to which it is intended to be attached.

Figure 13:
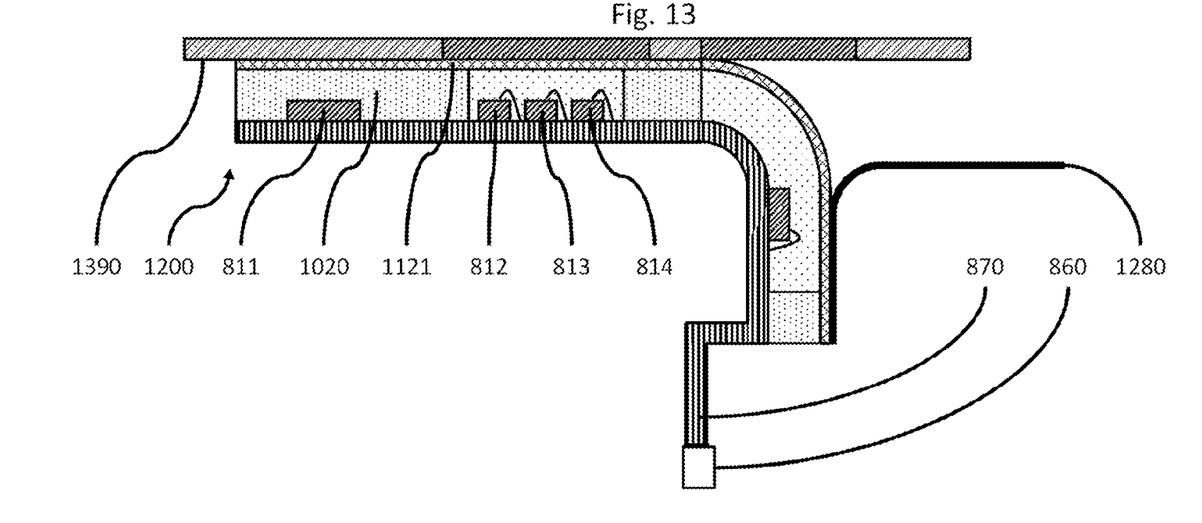
FIG. 13 shows attachment of a sensor system.

FIG. 13 illustrates how the sensor system 1200 can be attached to the casing 1390. The protective film 1280 can be pulled off from the sensor system 1200 and the sensor system 1200 can subsequently be rolled onto the casing. As continuous contact as possible between the encapsulation layer of the sensor system 1200 and the casing 1390 can be achieved in this way. In particular, influences that could adversely influence the functionality of the sensor elements can be avoided.

After the sensor system 1200 has been attached, the material of the encapsulation layer 1020, 922, 923 can be thermally cured. In other words, the material for attachment to the casing 1390 can initially be flexible, e.g., in the form of a gel, in order to attain the best possible contact with the possibly not completely smooth surface of the casing 1390, and can be cured after attachment in order to attain the desired properties for the transmission of light or ultrasonic waves, for example.

Figure 14:
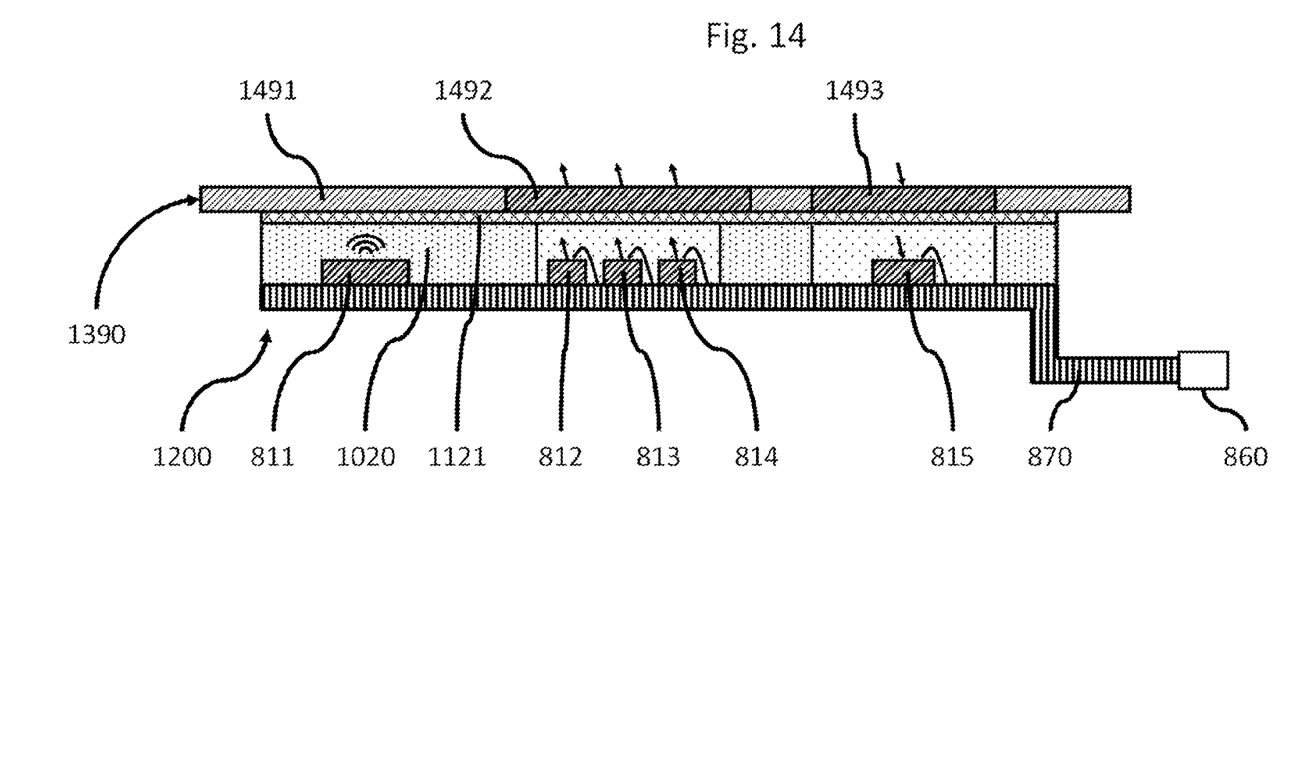
FIG. 14 shows a sensor system attached to a casing.

In a manner corresponding to the position of the sensor elements 811, 812, 813, 814, 815, the casing 1390 can have different sections 1491, 1492, 1493 configured for example for the transmission of ultrasonic waves or light.

A sensor system 1200 for attachment to a casing 1390 comprising at least one sensor element 811 is thus proposed in the figures. The sensor element 811 is configured for detecting an environment property of an environment which, with the sensor system attached to the casing 1390, is situated on the opposite side of the casing 1390 with respect to the sensor system 1200. The sensor system additionally has an encapsulation layer 1020, 922, 923, 1121, wherein the sensor element 811 is embedded in the encapsulation layer 1020, 922, 923, 1121 and wherein the encapsulation layer 1020, 922, 923, 1121 provides a contact surface for attaching the sensor system 1200 to the casing 1390. The sensor system 1200 and the encapsulation layer can be configured in particular to adapt to casings 1390 with a wide variety of surface geometries. The sensor system can be suitable in particular for being attached to casings having curved surfaces. The sensor system can be produced totally independently of the casing and can be attached to the casing only after the latter has been produced. In this way, it is possible to use production methods that are established and/or optimized in each case for both components. The casing can be the casing of a domestic appliance but also an interior trim of a motor vehicle, for example a part of the dashboard of a motor vehicle.

The sensor element 811 can be fabricated from a semiconductor material. Sensor elements composed of semiconductor materials can be distinguished by a long lifetime. Moreover, they can be produced cost-effectively in large numbers.

The sensor element 811 can be an ultrasonic transceiver, for example. The advantages of the mechanical adaptability to different surface geometries by means of the encapsulation layer can be manifested particularly clearly precisely in association with an ultrasonic transceiver.

The sensor system 1200 can have a protective film 1280 applied on the contact surface of the encapsulation layer. The protective film 1280 can enable the sensor system 1200 to be safely transported from the location where said sensor system is produced to the location where it is attached to the casing. In particular, contamination of the contact surface with foreign particles can be avoided.

The sensor system can have a printed circuit board 870, wherein the sensor element 811 is mechanically and/or electrically connected to the printed circuit board 870. The printed circuit board 870 can serve in particular to connect a plurality of sensor elements 811, 812, 813, 814, 815 to one another. The printed circuit board 870 can simplify the electrical connection of the sensor elements 811, 812, 813, 814, 815 to further elements of the device to which the casing belongs.

The printed circuit board 870 can be arranged in particular at a side of the sensor system 1200 situated opposite the contact surface. This can make it possible for the active side of the sensor elements 811, 812, 813, 814, 815 to be oriented directly toward the device. The influence of the printed circuit board 870 on the determination of an environment condition can thus be minimized.

The printed circuit board 870 can be at least partly light-transmissive. This can allow the encapsulation layer 1020, 922, 923 to be optically cured after the sensor system 1200 has been attached.

The sensor system 1200 and/or at least one of the sensor elements 811, 812, 813, 814, 815 can have an integrated circuit. By way of example, a first evaluation of the signals generated by one of the sensor elements 811, 812, 813, 814, 815 can be performed by the integrated circuit.

The sensor system 1200 can have a plug connector 860, by means of which said sensor system can be electrically connected in a simple manner to further electrical components of the device to which the casing 1390 belongs.

The encapsulation layer can comprise an adhesive layer 1121, wherein the adhesive layer 1121 has the contact surface used to attach the sensor system 1200 to the casing 1390.

The encapsulation layer can comprise a curable material, in particular a curable polymer. In this case, the curable material can be in particular a thermally curable material and/or a material that is curable under light, in particular UV light. During attachment, the encapsulation layer can thus still have the necessary flexibility in order to adapt to a curved surface of the casing 1390, and afterward it can be fully cured.

The sensor system 1200 can be rollable in particular onto the casing 1390. This makes it possible particularly effectively to avoid the arising of unwanted inclusions, e.g., air inclusions, between the casing 1390 and the sensor system 1200.

Furthermore, it is conceivable for the encapsulation layer 1020 to have an acoustic lens. This can further improve the acoustic coupling of an ultrasonic transceiver 811 to the casing 1390.

The encapsulation layer can have at least one translucent, in particular transparent, section 922, 923 extending parallel to the contact surface and reaching from the sensor element 812, 813, 814, 815 as far as the contact surface. This can enable optical sensor elements 812, 813, 814, 815 to be integrated into the sensor system 1200 as well. In this way, environment properties can be detected optically as well.

Furthermore, the encapsulation layer can have at least one section 1020 extending parallel to the contact surface and reaching from the sensor element 811 as far as the contact surface and serving for acoustically coupling the sensor element 811 to the casing 1390. In particular, the acoustic impedance of the sensor element 811 can be matched to the acoustic impedance of the casing 1390 with the aid of the section 1020.

The sensor system can comprise a photodiode 815 and/or light-emitting diodes 812, 813, 814, in particular laser diodes. The latter can allow optical detection of the environment of the casing on the side facing away from the sensor system. The encapsulation layer 922, 923 can have optical lenses in order that the light transmitted and/or received by the sensor elements 812, 813, 814, 815 is focused in a targeted manner.

The encapsulation layer can comprise a gel, in particular, which can adapt to different surface geometries in a simple manner.

The encapsulation layer can be configured in particular for compensating for different coefficients of thermal expansion of the casing 1390 and of the sensor element 811 and/or of the printed circuit board 870.

In examples, the encapsulation layer can comprise a material which interacts catalytically with a material, in particular a metal, of the casing. This can simplify the permanent attachment of the sensor system 1200 to the casing.

Some exemplary embodiments are defined by the following examples:

Example 1. A sensor system (1200) for attachment to a casing (1390),
   comprising at least one sensor element (811, 812, 813, 814, 815),
   wherein the sensor element (811, 812, 813, 814, 815) is configured for detecting an environment property of an environment which, with the sensor system (1200) attached to the casing (1390), is situated on the opposite side of the casing (1390) with respect to the sensor system (1200), and
   comprising an encapsulation layer (1020, 922, 923, 1121),
   wherein the sensor element (811, 812, 813, 814, 815) is embedded in the encapsulation layer (1010, 922, 923, 1121), and
   wherein the encapsulation layer (1010, 922, 923, 1121) has a contact surface for attaching the sensor system (1200) to the casing (1390).

Example 2. The sensor system (1200) according to example 1,
   wherein the sensor element (811, 812, 813, 814, 815) is fabricated from a semiconductor material.

Example 3. The sensor system (1200) according to example 1 or 2,
   wherein the sensor element (811) comprises an ultrasonic transceiver, in particular a capacitive and/or a piezoelectric ultrasonic transceiver.

Example 4. The sensor system (1200) according to any of examples 1 to 3,
   wherein the sensor system (1200) has a protective film (1280) applied on the contact surface.

Example 5. The sensor system (1200) according to any of examples 1 to 4,
   wherein the sensor system (1200) has a printed circuit board (870),
   wherein the sensor element (811, 812, 813, 814, 815) is mechanically and/or electrically connected to the printed circuit board (870).

Example 6. The sensor system (1200) according to example 5,
   wherein the printed circuit board (870) is arranged at a side of the sensor system (1200) situated opposite the contact surface.

Example 7. The sensor system (1200) according to example 5 or 6,
   wherein the printed circuit board (870) is at least partly light-transmissive.

Example 8. The sensor system (1200) according to any of examples 1 to wherein the sensor system (1200), in particular the sensor element (811, 812, 813, 814, 815), has an integrated circuit.

Example 9. The sensor system (1200) according to any of examples 1 to 8,
   wherein the sensor system (1200) has a plug connector (860).

Example 10. The sensor system (1200) according to any of examples 1 to 9,
   wherein the encapsulation layer (1020, 922, 923, 1121) comprises an adhesive layer (1121),
   wherein the adhesive layer (1121) has the contact surface.

Example 11. The sensor system (1200) according to any of examples 1 to 10,
   wherein the encapsulation layer (1020, 922, 923, 1121) comprises a curable material, in particular a curable polymer.

Example 12. The sensor system (1200) according to example 11,
   wherein the curable material is a thermally curable material.

Example 13. The sensor system (1200) according to example 11 or 12,
   wherein the curable material is a material that is curable under light, in particular ultraviolet light, UV light.

Example 14. The sensor system (1200) according to any of examples 1 to 13,
   wherein the sensor system (1200) is rollable onto the casing (1390).

Example 15. The sensor system (1200) according to any of examples 1 to 14,
   wherein the encapsulation layer (1020, 922, 923, 1121) has an acoustic lens.

Example 16. The sensor system (1200) according to any of examples 1 to 15,
   wherein the encapsulation layer (1020, 922, 923, 1121) has at least one translucent, in particular transparent, section (922, 923) extending parallel to the contact surface and reaching from the sensor element (812, 813, 814, 815) as far as the contact surface.

Example 17. The sensor system (1200) according to any of examples 1 to 16,
wherein the encapsulation layer (1020, 922, 923, 1121) has at least one section (1020) extending parallel to the contact surface and reaching from the sensor element (811) as far as the contact surface and serving for acoustically coupling the sensor element to the casing (1390).

Example 18. The sensor system (1200) according to any of examples 1 to 17,
wherein the sensor system (1200) comprises a light-emitting diode (812, 813, 814), in particular a laser diode.

Example 19. The sensor system (1200) according to any of examples 1 to 18,
wherein the sensor system (1200) comprises a photodiode (815).

Example 20. The sensor system (1200) according to any of examples 1 to 19,
wherein the sensor system (1200) comprises an optical lens.

Example 21. The sensor system (1200) according to any of examples 1 to 20,
wherein the encapsulation layer (1020, 922, 923, 1121) comprises a gel.

Example 22. The sensor system (1200) according to any of examples 1 to 21,
wherein the encapsulation layer (1020, 922, 923, 1121) is configured for compensating for different coefficients of thermal expansion of the casing and of the sensor element (811, 812, 813, 814, 815) and/or of the printed circuit board (870).

Example 23. The sensor system (1200) according to any of examples 1 to 22,
wherein the encapsulation layer (1020, 922, 923, 1121) comprises a material which interacts catalytically with a material, in particular a metal, of the casing (1390).

Although specific exemplary embodiments have been illustrated and described in this description, persons having customary knowledge in the art will recognize that a large number of alternative and/or equivalent implementations can be chosen as substitution for the specific exemplary embodiments shown and described in this description, without departing from the scope of the invention disclosed. The intention is for this application to cover all adaptations or variations of the specific exemplary embodiments discussed here. Therefore, the intention is for this invention to be restricted only by the claims and the equivalents of the claims.

What is claimed is:

1. A sensor system for attachment to a casing, the sensor system comprising:
an encapsulation layer comprising a contact surface for attaching the sensor system to the casing; and
at least one sensor element, embedded in the encapsulation layer, configured to detect an environment property of an environment,
wherein, when the sensor system is attached to the casing, the environment is situated on an opposite side of the casing with respect to the sensor system,
wherein at least one of:
the sensor system is configured to roll onto the casing, or
the encapsulation layer comprises a material that interacts catalytically with a metal material of the casing.

2. The sensor system as claimed in claim 1,
wherein the at least one sensor element comprises a semiconductor material.

3. The sensor system as claimed in claim 1,
wherein the at least one sensor element comprises an ultrasonic transceiver.

4. The sensor system as claimed in claim 1,
wherein the sensor system has a protective film on the contact surface.

5. The sensor system as claimed in claim 1,
wherein the sensor system has a printed circuit board,
wherein the at least one sensor element is at least mechanically or electrically connected to the printed circuit board.

6. The sensor system as claimed in claim 5, wherein the printed circuit board is arranged at a side of the sensor system situated opposite the contact surface.

7. The sensor system as claimed in claim 5,
wherein the printed circuit board is at least partly light-transmissive.

8. The sensor system as claimed in claim 1,
wherein the at least one sensor element has an integrated circuit.

9. The sensor system as claimed in claim 1,
wherein the sensor system has a plug connector.

10. The sensor system as claimed in claim 1,
wherein the encapsulation layer comprises an adhesive layer, and
wherein the adhesive layer is between the contact surface and the casing and is directly attached to both the contact surface and the casing for attaching the sensor system to the casing.

11. The sensor system as claimed in claim 1,
wherein the encapsulation layer comprises a curable material.

12. The sensor system as claimed in claim 11,
wherein the curable material is a thermally curable material.

13. The sensor system as claimed in claim 11,
wherein the curable material is a material that is curable under light.

14. The sensor system as claimed in claim 1,
wherein the sensor system is configured to roll onto the casing.

15. The sensor system as claimed in claim 1,
wherein the encapsulation layer has an acoustic lens.

16. The sensor system as claimed in claim 1,
wherein the encapsulation layer has at least one translucent section extending parallel to the contact surface and reaching from the at least one sensor element as far as the contact surface.

17. The sensor system as claimed in claim 1,
wherein the encapsulation layer has at least one section extending parallel to the contact surface and reaching from the at least one sensor element as far as the contact surface and serving for acoustically coupling the at least one sensor element to the casing.

18. The sensor system as claimed in claim 1,
wherein the sensor system comprises a light-emitting diode.

19. The sensor system as claimed in claim 1,
wherein the sensor system comprises a photodiode.

20. The sensor system as claimed in claim 1,
wherein the sensor system comprises an optical lens.

21. The sensor system as claimed in claim 1, wherein the encapsulation layer comprises a gel.

22. The sensor system as claimed in claim 5, wherein the encapsulation layer is configured for compensating for different coefficients of thermal expansion of at least one of the casing, the at least one sensor element, or the printed circuit board.

23. The sensor system as claimed in claim 1, wherein the encapsulation layer comprises the material that interacts catalytically with a metal material of the casing.

* * * * *